United States Patent
Overhauser

(10) Patent No.: US 7,653,519 B1
(45) Date of Patent: Jan. 26, 2010

(54) METHOD AND MECHANISM FOR MODELING INTERCONNECT STRUCTURES FOR INTEGRATED CIRCUITS

(75) Inventor: David Overhauser, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 308 days.

(21) Appl. No.: 11/404,636

(22) Filed: Apr. 13, 2006

(51) Int. Cl.
 *G06F 17/50* (2006.01)
(52) U.S. Cl. .................... 703/1; 716/4; 438/18
(58) Field of Classification Search .......... 703/1
 See application file for complete search history.

(56) References Cited

U.S. PATENT DOCUMENTS

| | | | |
|---|---|---|---|
| 6,057,171 A * | 5/2000 | Chou et al. | 438/15 |
| 6,174,741 B1 * | 1/2001 | Hansch et al. | 438/14 |
| 7,124,386 B2 | 10/2006 | Smith et al. | |
| 7,152,215 B2 | 12/2006 | Smith et al. | |
| 7,174,520 B2 | 2/2007 | White et al. | |
| 7,243,316 B2 | 7/2007 | White et al. | |
| 7,325,206 B2 | 1/2008 | White et al. | |
| 7,353,475 B2 | 4/2008 | White et al. | |
| 2003/0228714 A1 | 12/2003 | Smith et al. | |
| 2003/0229410 A1 | 12/2003 | Smith et al. | |
| 2003/0229881 A1 | 12/2003 | White et al. | |
| 2005/0037522 A1 | 2/2005 | Smith et al. | |
| 2005/0051809 A1 | 3/2005 | Smith et al. | |
| 2005/0132306 A1 | 6/2005 | Smith et al. | |
| 2005/0196964 A1 | 9/2005 | Smith et al. | |
| 2005/0235246 A1 | 10/2005 | Smith et al. | |

OTHER PUBLICATIONS

Oh et al, "Interconnect Modeling for VLSI's", International Conference on Simulation of Semiconductor Processes and Devices, pp. 203-206, Sep. 6-8, 1999.*
Stine et al, "Rapid Characterization and Modeling of Pattern-Dependent Variation in Chemical-Mechanical Polishing", IEEE Transactions on Semiconductor Manufacturing, vol. 11, No. 1, Feb. 1998.*
Kleveland et al, "High-Frequency Characterization of On-Chip Digital Interconnects", IEEE Journal of Solid-State Circuits, vol. 37, No. 6, Jun. 2002.*
Doong et al, "Infrastructure Development and Integration of Electrical-Based Dimensional Process Window Checking", IEEE Transactions on Semiconductor Manufacturing, vol. 17, No. 2, May 2004.*
Chao et al, "An Extraction Method to Determine Interconnect Parasitic Parameters", IEEE Transactions on Semiconductor Manufacturing, vol. 11, No. 4, Nov. 1998.*

* cited by examiner

*Primary Examiner*—Paul L Rodriguez
*Assistant Examiner*—Mary C Jacob
(74) *Attorney, Agent, or Firm*—Vista IP Law Group, LLP

(57) ABSTRACT

Disclosed are methods, systems, and structures for implementing interconnect modeling by using a test structure which include a variation of physical wire structures between local interconnects and distant interconnects. According to one approach, the impact of variations of the physical properties for neighborhood wires are considered for the electrical modeling of interconnects. This variation between the local and distant wire characteristics allows more accurate and robust interconnect modeling to be created.

17 Claims, 6 Drawing Sheets

METHOD AND MECHANISM FOR MODELING INTERCONNECT STRUCTURES FOR INTEGRATED CIRCUITS

BACKGROUND

The invention relates to technology for designing and verifying an integrated circuit ("IC") design.

An IC has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information, for example, of circuit primitives such as transistors and diodes, their sizes and interconnections.

An integrated circuit designer may uses a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

After an integrated circuit designer has created an initial integrated circuit layout, the integrated circuit designer then tests and optimizes the integrated circuit layout using a set of EDA testing and analysis tools. Common testing and optimization steps include extraction, verification, and compaction. The steps of extraction and verification are performed to ensure that the integrated circuit layout will perform as desired. The test of extraction is the process of analyzing the geometric layout and material composition of an integrated circuit layout in order to "extract" the electrical characteristics of the designed integrated circuit layout. The step of verification uses the extracted electrical characteristics to analyze the circuit design using circuit analysis tools.

Common electrical characteristics that are extracted from an integrated circuit layout include capacitance and resistance of the various "nets" (electrical interconnects) in the integrated circuit. These electrical characteristics are sometimes referred to as "parasitic" since these are electrical characteristics are not intended by the designer but result from the underlying physics of the integrated circuit design. For example, when an integrated circuit designer wishes to connect two different locations of an integrated circuit with an electrical conductor, the electrical circuit designer would ideally like perfect conductor with zero resistance and zero capacitance. However, the geometry of a real conductor, its material composition, and its interaction with other nearby circuit elements will create some parasitic resistance and parasitic capacitance. The parasitic resistance and parasitic capacitance affect the operation of the designed integrated circuit. Thus, the effect of the parasitic resistance and parasitic capacitance on the electrical interconnect must be considered.

To test an integrated circuit layout, the integrated circuit designer 'extracts' parasitic resistance and parasitic capacitance from the integrated circuit layout using an extraction application program. Then, the integrated circuit designer analyzes and possibly simulates the integrated circuit using the extracted parasitic resistance and parasitic capacitance information. If the parasitic resistance or parasitic capacitance causes undesired operation of the integrated circuit, then the layout of the integrated circuit must be changed to correct the undesired operation. Furthermore, minimizing the amount of parasitic resistance and parasitic capacitance can optimize the performance of the integrated circuit by reducing power consumption or increasing the operating speed of the integrated circuit.

Electrical models are often used in the process of extracting the electrical characteristics of an integrated circuit design. One approach that has been taken to model interconnect structures, such as wires, is to use a test chip having a test structure with a consistent array of wires. The array of consistent wires may be over an entire test chip, or there may be many different test structures with consistent arrays of wires on a test chip. The electrical performance of the test structure(s) is measured to form the underlying data for the interconnect models. The models are then used to verify and predict the electrical behavior of a given IC design.

One problem with this approach is that a test structure having a consistent array of wires may not correspond very well to a real-world IC design, which may have a large number of physical variations for its wires. In this case, variations in the physical structure of neighboring wires may not be properly accounted for when measuring the physical and electrical properties of the wires. As a result, the model formed from such a test structures may not accurately reflect the true electrical characteristics of an actual IC design. This lack of accuracy may result in faulty verification results for a given IC design, which could cause a failure of that design once it has been implemented as a commercial product.

SUMMARY

Some embodiments of the present invention provide an improved method and system for modeling the electrical behavior of interconnect structures. Some embodiments of the present invention address the problems of the prior solutions by using a test structure which include a variation of physical wire structures between local interconnects and distant interconnects. Other and additional objects, features, and advantages of the invention are described in the detailed description, figures, and claims.

DETAILED DESCRIPTION

Modeling of electrical properties for interconnects on an IC is a critical aspect of IC design and verification. If the basis for the IC design and analysis is flawed, then the results of the design and verification process may be flawed as well.

Some embodiments of the present invention address the problems of the prior solutions by using a test structure which include a variation of physical wire structures between "local" interconnects and "distant" interconnects. Local interconnects are the interconnects that are measured to build a model. Distant interconnects are the remote interconnects that are non-local, and are used to build the environment surrounding the local interconnects. According to some embodiments of the invention, the impact of variations of the physical properties for neighborhood wires are considered for the electrical modeling of interconnects. This variation between the local and distant wire characteristics allows more accurate and robust interconnect modeling to be created.

A test chip may include one or more test structures. Each test structure includes a pattern of local and distant interconnects. There may be one or more local interconnects in a test structure. In an exemplary embodiment, there are at least three local interconnects. There may be any number of distant interconnects in the test structure. In an exemplary embodiment, a plurality of distant interconnects are on either side of the local interconnect(s).

Figure 1:
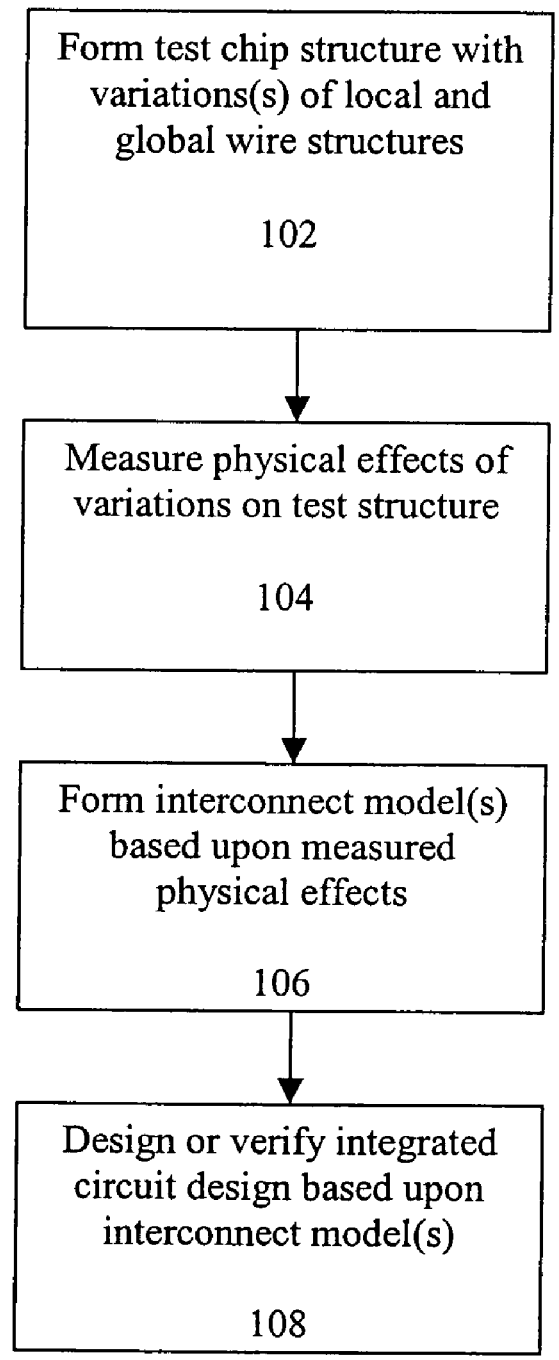
FIG. 1 is a process flow of a process for performing interconnect modeling according to an embodiment of the invention.

FIG. 1 is a process flow of an embodiment of the present invention. At 102, the process implements a test structure with variation(s) of local and distant wire structures. Rather than having a consistent array of wires across the entire test structure or a consistent array of wires across different substantial portions of the test structure, an intentional variation of the physical properties between the local and distant wires is formed on the test structure.

At 104, physical measurements are taken of the electrical properties of the test interconnects. If the variations of the local and distant wires produce physical effects, then those physical effects are measured and accounted for at 104.

The measurement results from 104 are used to form interconnect model(s) at 106. These interconnect models allow IC designers to predict the electrical and timing characteristics of wire structures that appear in IC designs. At 108, designers use the models to design or verify an IC design.

Figure 2:
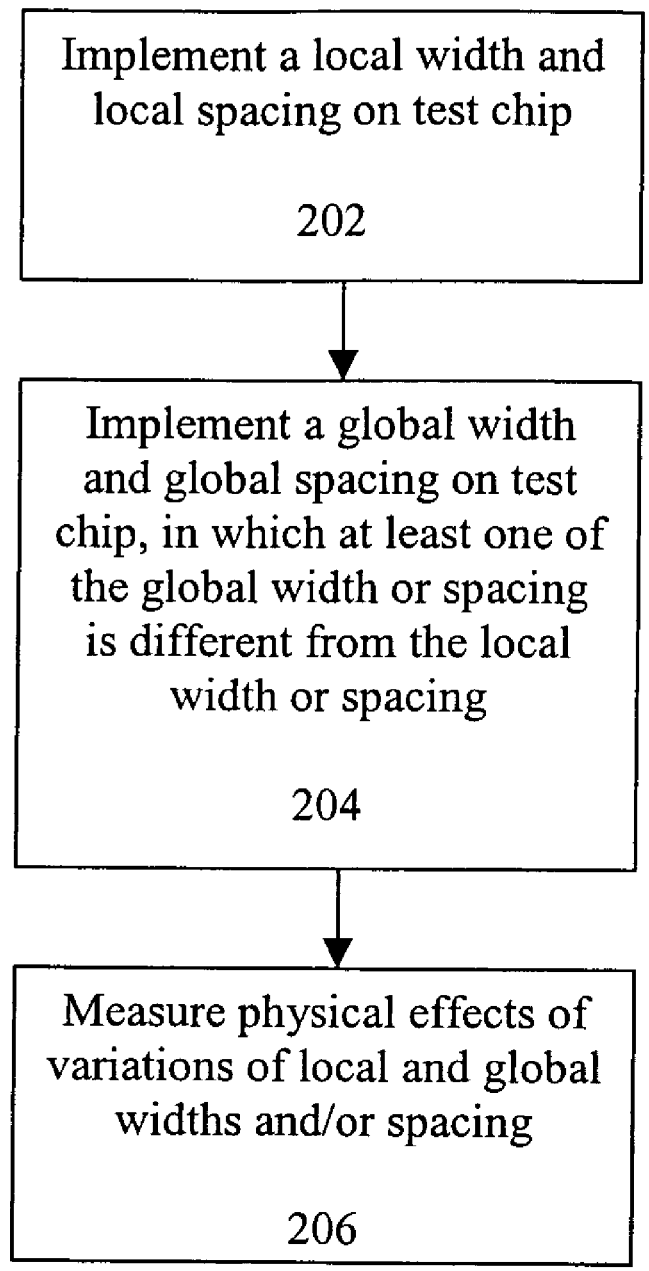
FIG. 2 is a process for implementing a test chip structure according to an embodiment of the invention.

FIG. 2 shows a process flow of a method for using a test structure according to some embodiments of the invention. This embodiment of the invention implants a test chip structure in which variations of wire width and wire spacing are modeled between local and distant wires.

At 202, wires having a local width and local spacing are implemented on the test chip structure. The local wires refer to a set of wires for which measurements are made to provide modeling of electrical characteristics. Any number of wires may be considered "local".

At 204, the non-local wires structures, referred to herein as "distant" wires, are implemented on the test structure. The distant wires form one or more sets of neighboring wires which may have differing width or spacing from the local wires. In 204, at least either, or both, of the width or spacing of the distant wires are different from either, or both, of the width or spacing of the local wires. In one approach, only the pitch of the wires are varied between the local and distant wires. In a second embodiment, only the width of the wires are varied between the local and distant wires. In a third embodiment, both the width and spacing are varied between the local and distant wires.

At 206, the physical effects of the variations of local and distant wires are measured to form the interconnect models. These interconnect models are used by IC designers to predict the electrical and timing characteristics of wires that appear in IC designs. In one embodiment, the interconnect models are employed and integrated within an EDA tool, such as an EDA verification or extraction tool.

Figure 3:
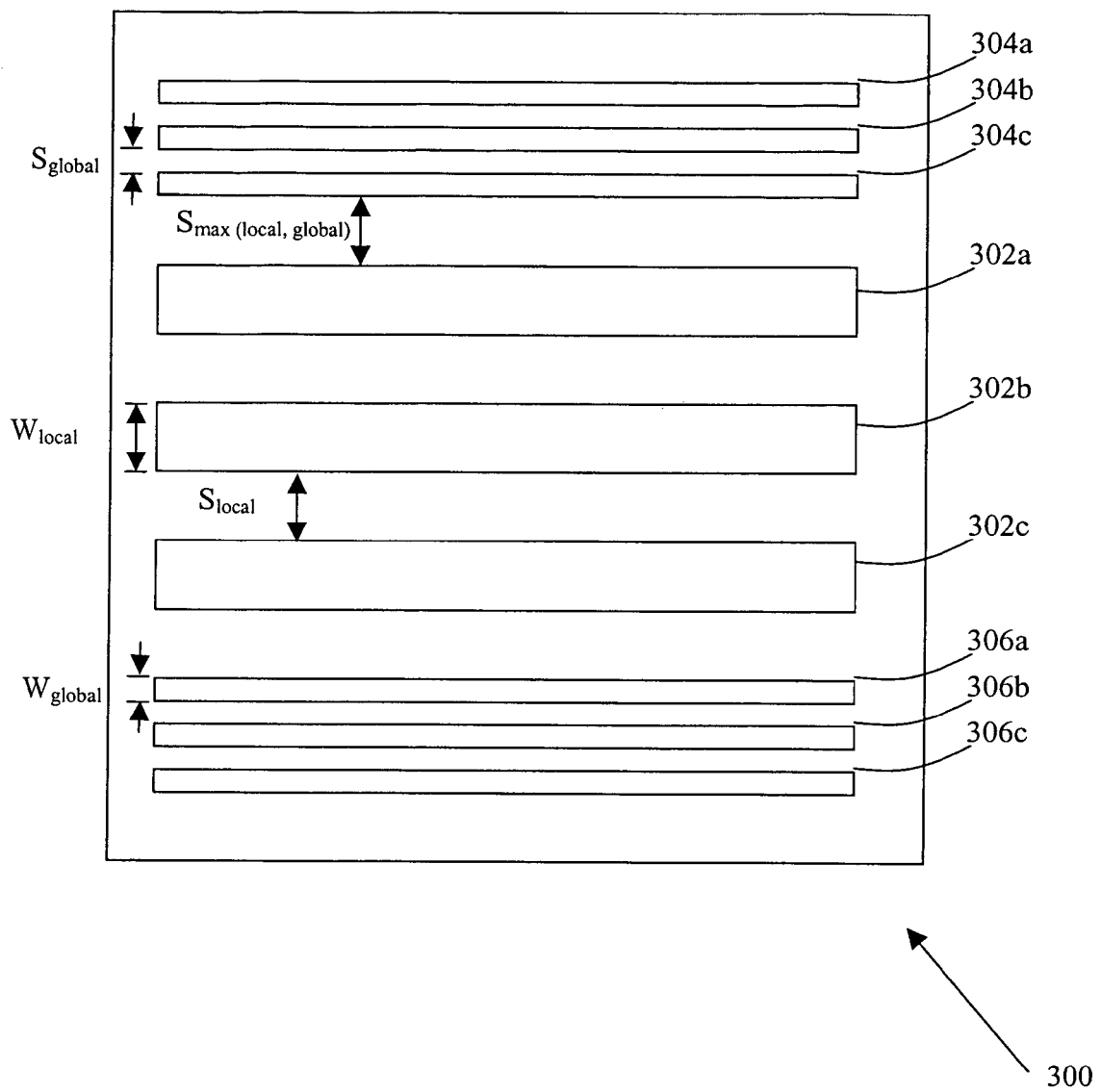
FIG. 3 illustrates an example test chip structure according to an embodiment of the invention.

FIG. 3 illustrates an example of a test structure 300 that includes variations between local and distant wires, according to some embodiments of the invention. Test chip structure 300 includes local wires 302a, 302b, and 302c. Test chip structure 300 also includes distant wires 304a, 304b, and 304c on one side of local wires 302a, 302b, and 302c. Distant wires 306a, 306b, and 306c are located on the other side of local wires 302a, 302b, and 302c. While not shown in FIG. 3, those of ordinary skill would recognize that additional circuitry would connect to the local wires to provide electrical measurements. Any suitable circuitry may be used in embodiments of the invention to provide electrical measurements of the local wires. In some embodiment, active circuitry may also be connected to the local wires.

Each of the local wires 302a, 302b, and 302c has a local width value $W_{local}$. Each of the local wires 302a, 302b, and 302c is also associated with a local spacing distance $S_{local}$ between each of the wires.

The distant wires 304a, 304b, 304c, 306a, 306b, and 306c each has a distant width value $W_{distant}$. Each of the distant wires is also associated with a spacing distance $S_{distant}$ between each of the wires.

In one embodiment, the spacing between the distant and local wires is the maximum of either the local or distant spacing distances ($S_{max\ (local,\ distant)}$). In alternate embodiments, other spacing distance can also be employed between the local and distant wires. For example, the minimum of either the local or distant spacing distances may be employed as the spacing distance between local and distant wires. Other and additional spacing distances may also be employed.

In operation according to certain embodiments, a test structure would be designed and fabricated having variations between the local and distant widths and spacing distances, such as the variations in widths and spacing distances as illustrated in FIG. 3. The process rules and conditions for the fabricated test chip/test structures would be provided by a given fabrication facility. Different process rules and conditions would be provided by different fabrication facilities. The fabricated test structure would therefore include wires in which local wires have different widths and/or spacing distances from distant wires. Measurements are made of the electrical characteristics of the local wires. The measurement results are used to create one or more interconnect models that are specific for a set of fabrication processes and conditions.

Figure 4:
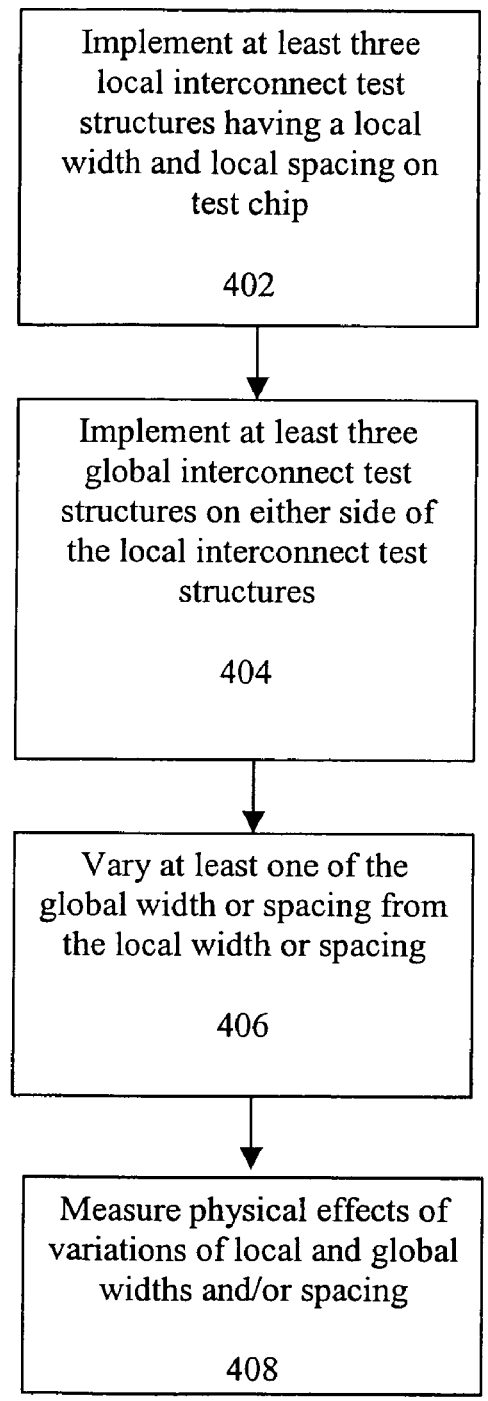
FIG. 4 is an alternate process for implementing a test chip structure according to an embodiment of the invention.

FIG. 4 shows a process flow of a method for implementing interconnect models according to an embodiment of the invention. At 402 the process implements at least three local interconnects having a local width for the interconnects. The local interconnects are also associated with a local spacing distance between each of the local interconnects.

At 404, the process implements at least three distant interconnects on either side of the local interconnects. The at least three distant interconnects on either side of the local wires have a distant width for the interconnects. The distant interconnects are also associated with a distant spacing distance between each of the distant interconnects.

Either, or both, of the wire spacing or wire widths are varied between the local wires and the distant wires (406). At 408, the physical effects of the variation of local and distant wire widths and/or spacing are measured and used to develop interconnect model(s).

Figure 5:
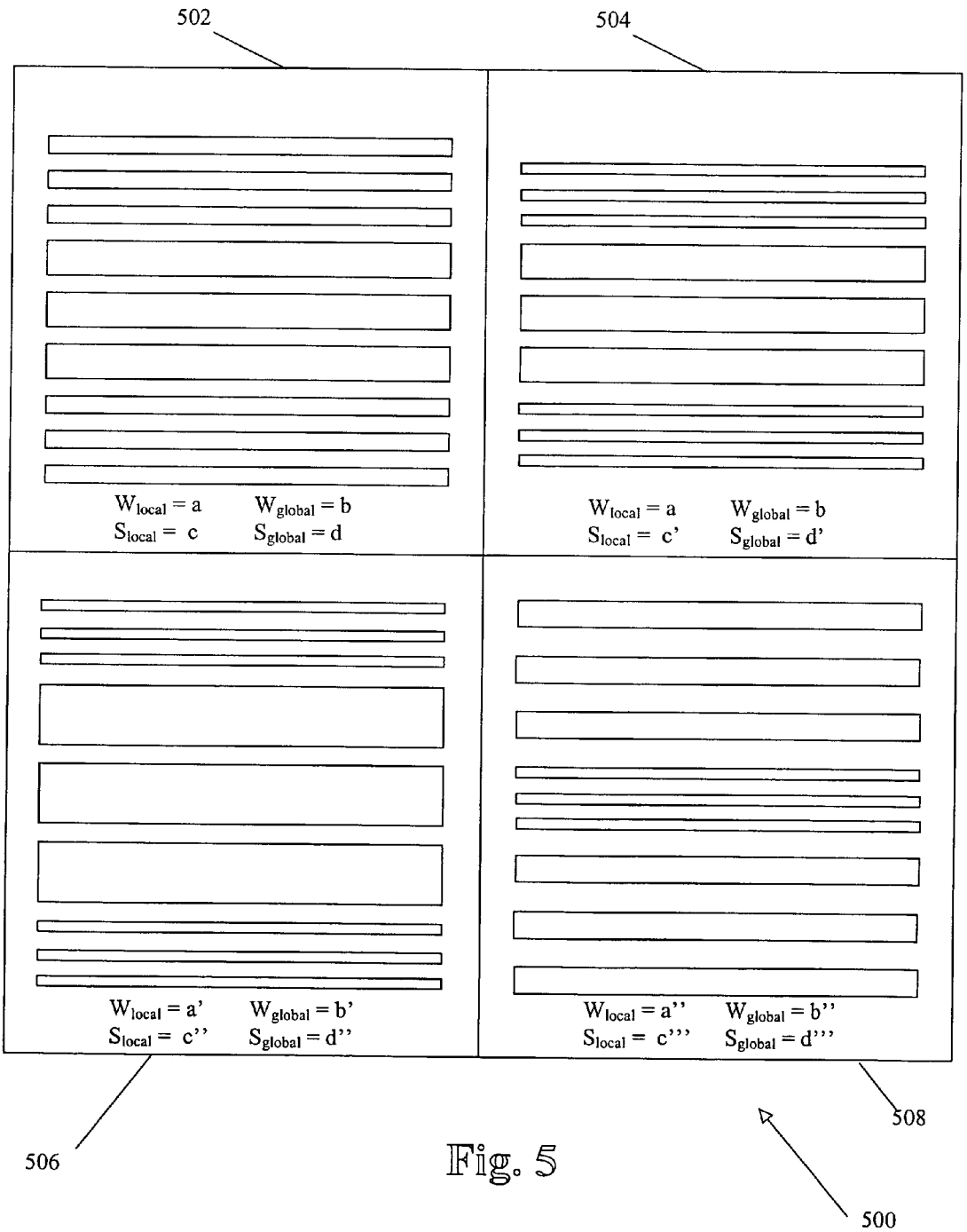
FIG. 5 illustrates an example test chip structure having multiple regions of different local and distant wire variations according to an embodiment of the invention.

A single test chip may contain multiple test structures (or regions) having different variations between local and distant physical characteristics. FIG. 5 illustrates an example test chip 500 having four test structures 502, 504, 506, and 508. Each of the test structures 502, 504, 506, and 508 has a different configuration of local and distant widths and spacing values. For example, test structure 502 is configured such that the width of the local wires is $W_{local}=a$ and the width of the distant wires is a different value $W_{distant}=b$. The spacing distances are configured in test structure 502 such that the local spacing distance $S_{local}=c$ and the distant spacing distance have the value $S_{distant}=d$. Similarly, each of the other test structures 504, 506, and 508 has its own local and distant width and spacing values as indicated.

This type of test chip having different test structures permits a single test chip to provide measurement data for multiple different configurations of local and distant wires. The configuration of different regions should be designed such that the remote variations from one test structure do not affect the measurement results in a second test structure. Therefore, sufficient spacing distances should be configured between the wire structures in the different test structures to avoid non-desirable crosstalk and other electrical influence between the different test structures.

SYSTEM ARCHITECTURE OVERVIEW

Figure 6:
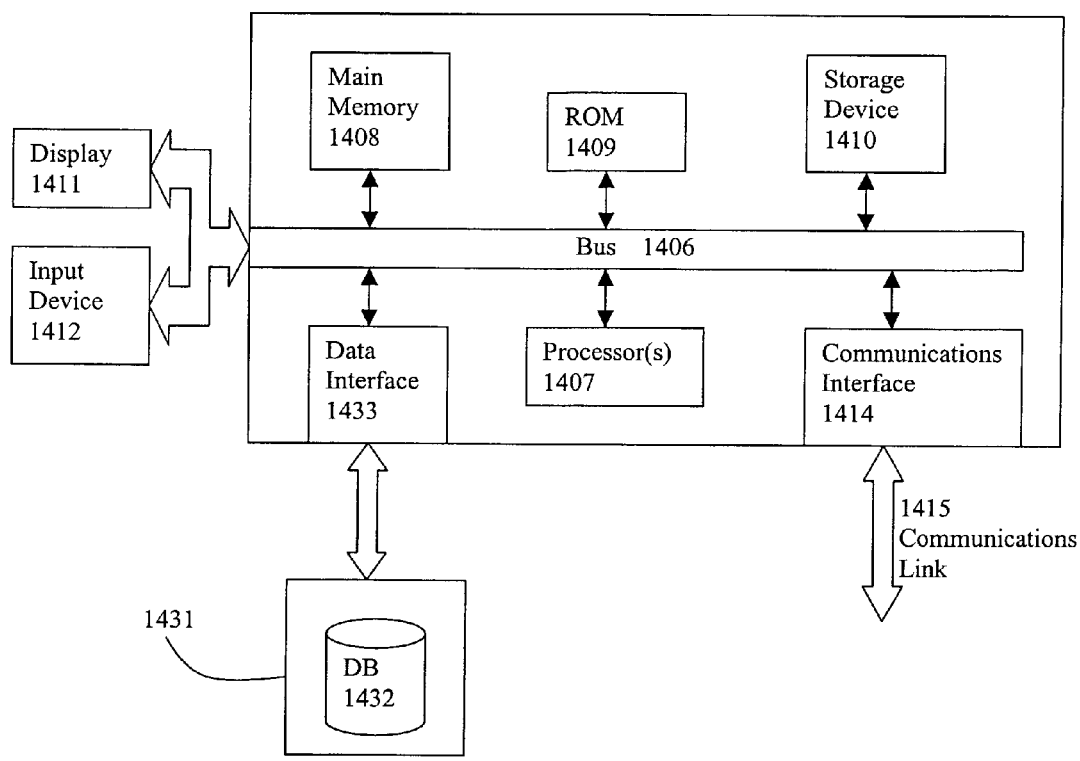
FIG. 6 illustrates an example computing architecture with which embodiments of the invention may be practiced.

FIG. 6 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that contains a database 1432 that is accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g., instructions, messages and data.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer-implemented method for performing interconnect modeling for an integrated circuit design, comprising:

identifying a test structure, the test structure comprising a two-dimensional test pattern which comprises at least three local interconnects and at least three distant interconnects on at least one side of the at least three local interconnects, in which the at least three local interconnects are associated with a local interconnect width value and a local interconnect spacing value and the at least three distant interconnects are associated with a distant interconnect width value and a distant interconnect spacing value, where either or both of the local interconnect width and local interconnect spacing values are respectively different from the distant interconnect width and distant interconnect spacing values;

measuring electrical characteristics of one or more of the at least three local interconnects;

forming an interconnect model based at least in part upon results of the act of measuring the electrical characteristics, in which the act of forming an interconnect model is performed by at least one processor, and the at least three distant interconnects represent a second set of interconnects which are not the at least three local interconnects and are used for an environment surrounding the at least three local interconnects; and displaying the electrical characteristics on a display apparatus or storing the electrical characteristics in a computer readable storage medium or a storage device.

2. The method of claim 1 in which the local interconnect width value is different from the distant interconnect width value and the local interconnect spacing value is the same as the distant interconnect spacing value.

3. The method of claim 1 in which the local interconnect spacing value is different from the distant interconnect spacing value and the local interconnect width value is the same as the distant interconnect width value.

4. The method of claim 1 in which both the local interconnect spacing value and the local interconnect width value are different from the distant interconnect width value and distant interconnect spacing value.

5. The method of claim 1 further comprising the act of designing or verifying an integrated circuit using the interconnect model.

6. The method of claim 5 in which extraction analysis is performed on the integrated circuit design based upon the interconnect model.

7. The method of claim 1, further comprising placing multiple test structures on a test chip, in which some or all of the multiple test structures comprises a different configuration of the distant and local interconnect width and interconnect spacing values.

8. The method of claim 1 in which the interconnect model is embedded within an electronic design automation tool.

9. The method of claim 8 in which the electronic design automation tool is an extraction tool.

10. A computer-implemented method for performing interconnect modeling for an integrated circuit design, comprising:

identifying a test structure, the test structure comprising a two-dimensional test pattern which comprises two or more local interconnects and one or more distant interconnects on at least one side of the two or more local interconnects, in which the two or more local interconnects are associated with a local interconnect width value and a local interconnect spacing value, and the one or more distant interconnects are associated with a distant interconnect width value and a distant interconnect spacing value, where either or both of the local width and local spacing values being different from the distant width and distant spacing values, and the local interconnect spacing value represents a spacing between two local interconnects of the two or more local interconnects;

measuring electrical characteristics of only the two or more local interconnects;

forming an interconnect model based at least in part upon results of the act of measuring the electrical characteristics, in which the act of forming the interconnect model is performed by at least one processor, and the one or more distant interconnects represent a second set of interconnects which are not the two or more local interconnects and are used for an environment surrounding the two or more local interconnects; and displaying the electrical characteristics on a display apparatus or storing the electrical characteristics in a computer readable storage medium or a storage device.

11. The method of claim 10 further comprising the act of designing or verifying an integrated circuit using the interconnect model.

12. The method of claim 11 in which extraction analysis is performed on the integrated circuit design based upon the interconnect model.

13. The method of claim 10 in which the test structure is placed on a test chip having multiple test structures, in which some or all of the multiple test structures comprises a different configuration of the distant and local interconnect width and spacing values.

14. A system for performing interconnect modeling for an integrated circuit design, the system comprising:

means for identifying a test structure, the test structure comprising a two-dimensional test pattern which comprises at least three local interconnects and at least three distant interconnects on at least one side of the at least three local interconnects, in which the at least three local interconnects are associated with a local interconnect width value and a local interconnect spacing value and the at least three distant interconnects are associated with a distant interconnect width value and a distant interconnect spacing value, where either or both of the local interconnect width and local interconnect spacing values are respectively different from the distant interconnect width and distant interconnect spacing values;

means for measuring electrical characteristics of one or more of the at least three local interconnects;

at least a processor configured for forming an interconnect model based at least in part upon results of the means for measuring the electrical characteristics, in which the at least three distant interconnects represent a second set of interconnects which are not the at least three local interconnects and are used for an environment surrounding the at least three local interconnects; and a display apparatus configured for displaying the electrical characteristics on the display apparatus or a computer readable storage medium or a storage device configured for storing the electrical characteristics.

15. A system for performing interconnect modeling for an integrated circuit design, the system comprising:

means for identifying a test structure, the test structure comprising a two-dimensional test pattern which comprises two or more local interconnects and one or more distant interconnects on at least one side of the two or more local interconnects, in which the two or more local interconnects are associated with a local interconnect width value and a local interconnect spacing value, and the one or more distant interconnects are associated with a distant interconnect width value and a distant interconnect spacing value, where either or both of the local width and local spacing values being different from the distant width and distant spacing values, and the local interconnect spacing value represents a spacing between two local interconnects of the two or more local interconnects;

means for measuring electrical characteristics of only the two or more local interconnects;

at least a processor configured for forming an interconnect model based at least in part upon results of the means for measuring the electrical characteristics, in which the one or more distant interconnects represent a second set of interconnects which are not the two or more local interconnects and are used for an environment surrounding the two or more local interconnects; and a display apparatus configured for displaying the electrical characteristics or a computer readable storage medium or a storage device configured for storing the electrical characteristics.

16. A computer program product comprising a computer-usable storage medium having executable code stored thereupon which, when executed by a processor, causes the processor to execute a process for performing interconnect modeling for an integrated circuit design, the process comprising:

identifying a test structure, the test structure comprising a two-dimensional test pattern which comprises at least three local interconnects and at least three distant interconnects on at least one side of the at least three local interconnects, in which the at least three local interconnects are associated with a local interconnect width value and a local interconnect spacing value and the at least three distant interconnects are associated with a distant interconnect width value and a distant interconnect spacing value, where either or both of the local interconnect width and local interconnect spacing values are respectively different from the distant interconnect width and distant interconnect spacing values;

measuring electrical characteristics of one or more of the at least three local interconnects; and forming an interconnect model based at least in part upon results of the act of measuring the electrical characteristics, in which the act of forming the interconnect model is performed by at least a processor, and the at least three distant interconnects represent a second set of interconnects which are not the at least three local interconnects and are used for an environment surrounding the at least three local interconnects.

17. A computer program product comprising a computer-usable storage medium having executable code stored thereupon which, when executed by a processor, causes the processor to execute a process for performing interconnect modeling for an integrated circuit design, the process comprising:

identifying a test structure, the test structure comprising a two-dimensional test pattern which comprises two or more local interconnects and one or more distant interconnects on at least one side of the two or more local interconnects, in which the two or more local interconnects are associated with a local interconnect width value and a local interconnect spacing value, and the one or more distant interconnects are associated with a distant interconnect width value and a distant interconnect spacing value, where either or both of the local width and local spacing values being different from the distant width and distant spacing values, and the local interconnect spacing value represents a spacing between two local interconnects of the two or more local interconnects;

measuring electrical characteristics of only the two or more local interconnects; and forming an interconnect model based at least in part upon results of the act of measuring the electrical characteristics, in which the act of forming the interconnect model is performed by at least a processor, and the one or more distant interconnects represent a second set of interconnects which are not the two or more local interconnects and are used for an environment surrounding the two or more local interconnects.

* * * * *